United States Patent [19]

Mraz et al.

[11] Patent Number: 4,965,933
[45] Date of Patent: Oct. 30, 1990

[54] PROCESS FOR MAKING INSERT MOLDED CIRCUIT

[75] Inventors: James E. Mraz, Lindenhurst; Martin T. Schwartz, Glenview; James M. Kemp, Libertyville; Joel M. Schotanus, Wildwood; Donald P. Schwarz, Wheeling, all of Ill.

[73] Assignee: The Cherry Corporation, Waukegan, Ill.

[21] Appl. No.: 354,458

[22] Filed: May 22, 1989

[51] Int. Cl.⁵ .................... H01R 43/04; H01R 43/16
[52] U.S. Cl. ........................................ 29/882; 29/883; 29/414; 29/418; 29/527.4; 425/116; 425/289; 264/163; 264/155; 249/95
[58] Field of Search ............. 29/527.4, 876, 882, 29/883, 412–414, 418; 264/163, 154, 155, 272.17; 425/116, 292, 289; 249/95

[56] References Cited

U.S. PATENT DOCUMENTS 4,764,645  8/1988  Takasawa .................... 29/883
4,860,436  8/1989  Hirabayashi et al. .......... 29/527.4

FOREIGN PATENT DOCUMENTS 124075  10/1978  Japan .................... 264/272.17
215843  12/1984  Japan .................... 264/163
1197225  9/1986  Japan .................... 264/163

Primary Examiner—P. W. Echols
Attorney, Agent, or Firm—Willian Brinks Olds Hofer Gilson & Lione

[57] ABSTRACT

A method and apparatus are provided for forming insert molded circuits. The process includes inserting a circuit network comprised of a lace curtain with a plurality of individual circuits which are connected by interconnect members into a mold and then separating the individual circuits in the mold by cutting the interconnect members while the lace curtain is in the mold. After the interconnect members have been severed, plastic is injected into the mold thereby surrounding the individual traces. A mold for performing the process is disclosed which includes a retractable punch arrangement.

13 Claims, 3 Drawing Sheets

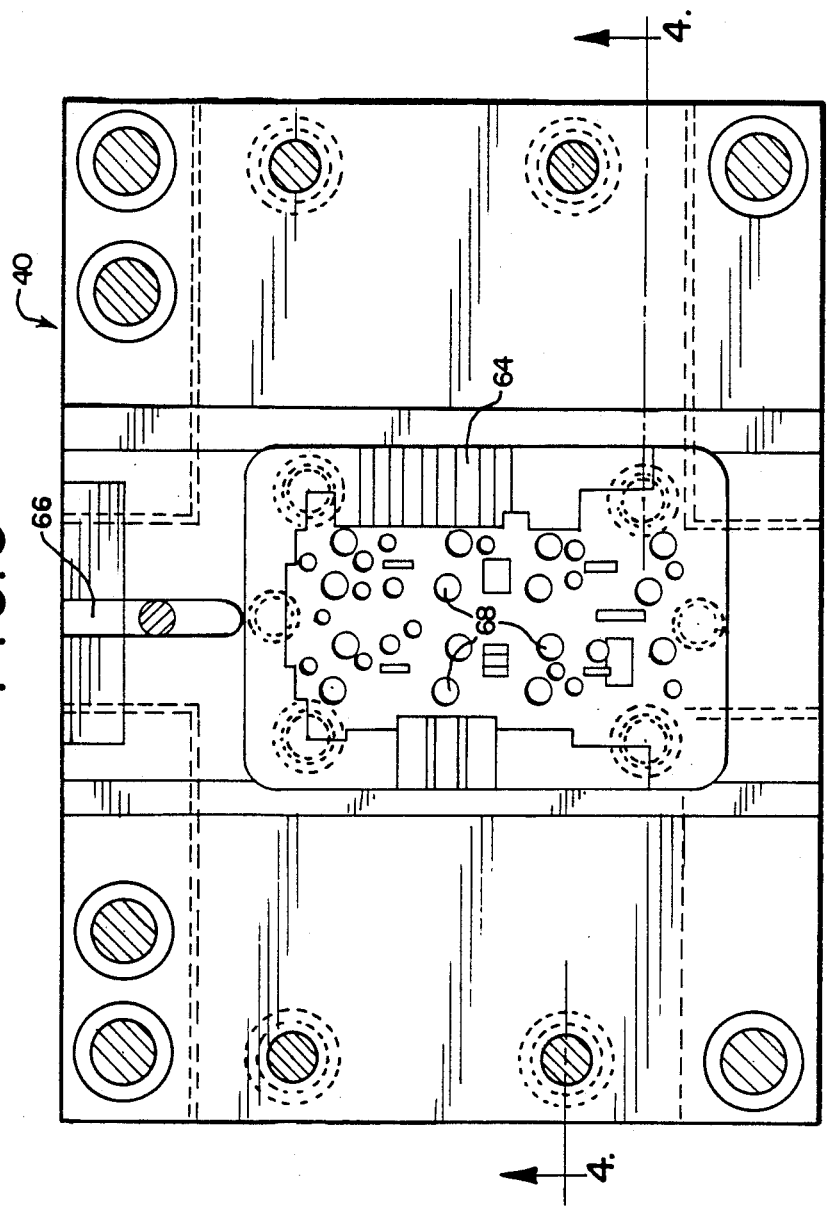

PROCESS FOR MAKING INSERT MOLDED CIRCUIT

BACKGROUND OF THE INVENTION

The present invention relates generally to a process and apparatus for making switch circuits and more particularly to a process and apparatus for making insert molded circuits from a lace curtain.

The process of making insert molded switch circuits as is presently used, provides a method or process wherein a large number of electrical circuits can be manufactured by using a single plate which has been stamped into what is known in the art as the "lace curtain." The lace curtain typically includes a plurality or network of different circuits which are joined together by a thin member (hereinafter referred to as an "interconnect member"), usually made of the same material as the circuits. The thin interconnect member allows a large number of circuits to be joined together in a single piece and facilitates the handling of the plurality of different circuits. Eventually, the lace curtain is inserted into a device which injects a plastic or an other engineering resin material to form a base for all of the circuits in the lace curtain.

The interconnect members which join the circuits of the lace curtain must be severed such that the desired individual circuits are formed. Typically, this is performed after the plastic has been injection molded around the lace curtain. The severing process is typically accomplished, as a secondary processing step, by cutting the lace curtain through holes in the plastic in the location where the undesired interconnect member is located. After the interconnect members have been severed, the connectors of the device may then be formed into the desired shape.

Insert molding switch circuits has become an increasingly popular method in view of the advantages over other available methods of making circuits. For example, alternative methods, which may use heat staking or soldering, degrade the flatness and/or otherwise deteriorate the dimensional integrity of a component. Insert molding on the other hand avoids the steps of heat staking or soldering. Insert molding eliminates the need for fasteners, adhesives and even some of the components themselves. Thus, insert molding is impervious to loosening and fastening corrosion. Additionally, insert molding provides devices with exceptional resistance to- vibration, moisture and temperature extremes. Since the insert molded circuits comprise a heat conductive cross-section, the insert molded circuit provides dissipation of heat an order of magnitude greater than plated traces. This additional heat dissipation permits the insert molded circuit to carry more current in less board space. In addition, the tolerances obtained through the insert molding process which include fixing a solid conductor in a steel mold tool and then molding a resin around the insert are far greater than the tolerances offered by an assembly process.

Although the presently used insert molding method provides many obvious advantages, it is not without disadvantages. For example, when the interconnect members are to be cut or severed since the plastic has been injection molded over the lace curtain, the lace curtain must be cut as an additional or secondary cutting process.

Additionally, one popular use for insert molded electrical circuits is in the automotive industry. Insert molded circuits are used in devices such as the control units for electric windows of automobiles. Therefore, it is not uncommon for these devices to come into contact with fluids, for example rainwater or fluids from accidental spills of beverages. In this event, the fluid will short circuit the electrical connection which has been severed (the interconnect member). That is, the fluid will fill the gap at a location where an open circuit previously existed thereby causing an electrical connection in an undesired location.

To avoid such consequences, it would be desirable to separate each individual circuit before the injection of the plastic or resin material. This would involve first severing the individual circuits and then separately placing the circuits in the mold into which the plastic is to be injected. This process, however, has obvious disadvantages. Such a process requires a substantial amount of handling of each individual circuit piece. The individual circuit pieces have to be precisely placed in the desired location, by an operator or suitable machine. Thus, such a process would require a substantial amount of additional time, thereby reducing the efficiency in producing such circuits.

Therefore, in view of the above, it is a primary object of the present invention to provide an efficient method and apparatus for forming a plurality of individual circuits from a lace curtain comprising a network of circuits.

It is a further object of the present invention to provide an apparatus and method for manufacturing a circuit which may be formed from a lace curtain into a plurality of individual circuits wherein the interconnect members of the lace curtain are severed and an insulating material fills the gap.

It is still a further object of the present invention to provide an insert molding process and apparatus for the process wherein the finished insert molded circuit is resistant to shorts caused by fluids.

SUMMARY OF THE INVENTION

To achieve the foregoing and other objects and in accordance with the purposes of the present invention, a method and apparatus for forming insert molded circuits is provided. The process includes providing a lace curtain which includes a network of circuits joined together by interconnect members and inserting the lace curtain circuit network into a mold which will sever the interconnect member. The circuit network is separated into the individual traces or circuits by severing the interconnect members while the lace curtain is in the mold. After the mold is closed, an insulating material is injected into the mold thereby surrounding the individual traces.

Therefore after the insulating material cools, the resulting insert molded circuit which is formed has traces that are electrically isolated. This process provides an efficient way to produce an insert molded circuit without the need for an additional secondary operation to cut out the interconnect members. Additionally, the circuit is resistant to shorts created by fluids that come into contact with the circuit.

In another aspect of the invention a mold is provided for executing the process of the present invention. The mold comprises a first section including a cavity section and a separate second section including a second mating cavity section. When the first and second sections are joined a cavity into which the insulating material is to be injected is defined. A punch mechanism is included which comprises at least one punch which is disposed in a predetermined location adjacent the interconnect member. Means are provided to secure the punch to a press. An aperture is provided in the mold to provide access for the insulating material which is to be injected into the cavity.

Additional objects, advantages and novel features of the invention will be set forth in part in the description which follows, and in part will become apparent to those skilled in the art upon examination of the following or may be learned by practice of the invention. The objects and advantages of the invention may be obtained by means of the combinations particularly pointed out in the appended claims.

BRIEF DESCRIPTION OF THE DRAWINGS

FIG. 3 illustrates a top sectional view of a preferred embodiment of the mold of the present invention.

DETAILED DESCRIPTION OF THE PRESENTLY PREFERRED EMBODIMENTS

Figure 1:
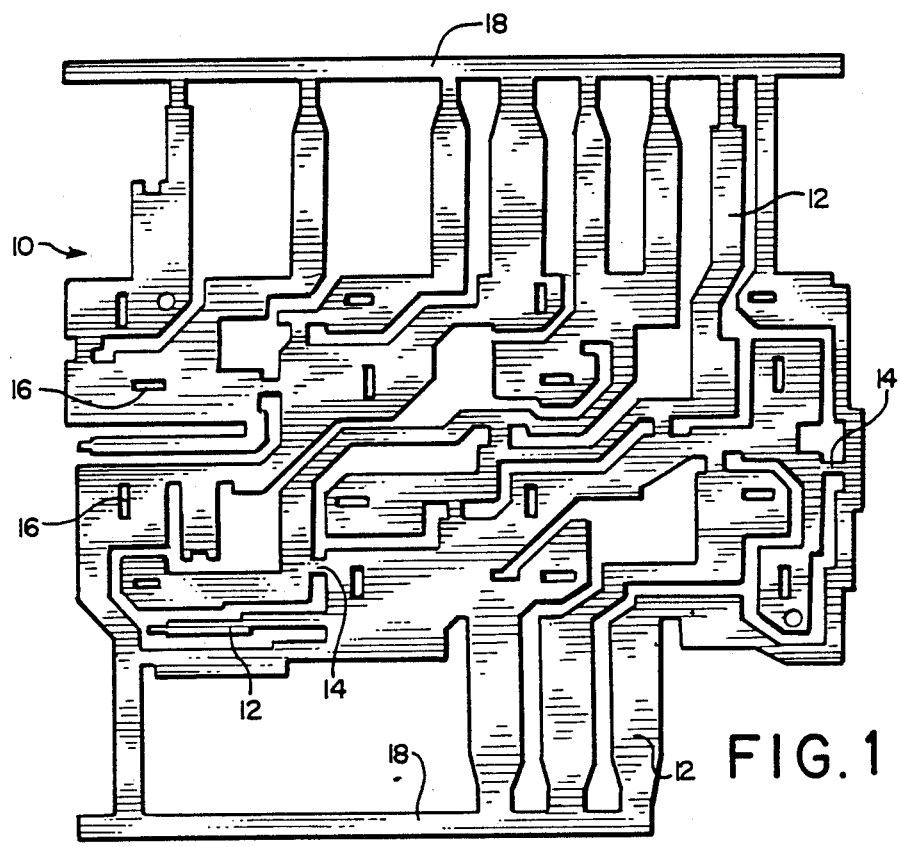
FIG. 1 is a plan view of a lace curtain comprising a plurality of circuits joined by interconnect members.

Referring now to the drawings and specifically to FIG. 1, a lace curtain is illustrated which comprises a plurality of what will eventually be individual circuits joined by a plurality of interconnect members. The lace curtain or lead frame may be made of any suitable electrically conducting material such as tin plated copper available from several commercial sources.

The lace curtain (designated generally by reference numeral 10) includes a plurality of electrical circuit connectors (designated generally by reference numeral 12). The network of electrical connectors 12 are joined together in the lace curtain 10 by a plurality of interconnect members (designated generally by reference numeral 14). The interconnect members hold all of the electrical connectors 12 together in the lace curtain for convenience of handling during the manufacturing process. The electrical connectors 12 may include a plurality of apertures 16 which may be used to connect the respective electrical connector 12 to the other mating electrical connector (not shown). Two end sections 18 are also initially connected to the lace curtain for purposes of handling but will, however, be severed before the product is finished. The respective individual electrical connectors 12 will be eventually bent or otherwise formed to have a predetermined shape such that the entire network of electrical connectors 12 may easily be inserted into a mating device (not shown).

Figure 2:
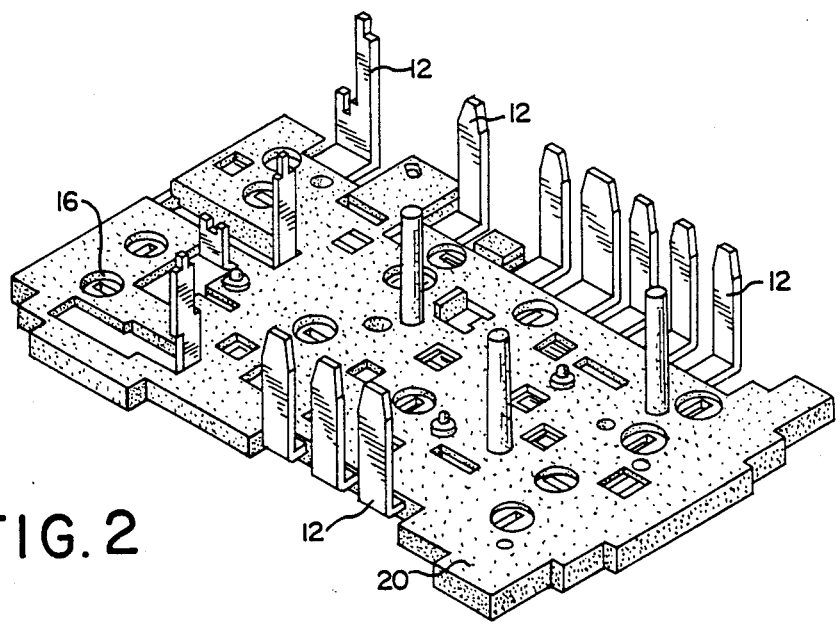
FIG. 2 is a perspective view of the insert molded circuit after the insulating base has been formed around the lace curtain.

FIG. 2 illustrates a finished electrical connector after the connectors have been formed into the predetermined shape and the insulating material has been injected around the lace curtain 10. The insulating material may be any suitable material which may be heated to form a flowable material and may be injected by known processes. Examples of suitable materials are plastics, polyesters or other engineering resins.

In the method of the present invention, the lace curtain 10 is inserted into a mold wherein which the insulating material is to be injected around the lace curtain. A commercially available machine may then be used to close the mold and inject the plastic or other insulating material into the mold to form the base 20 around the lace curtain. A suitable machine is available from Newbury Industries, Inc. (Newbury, Ohio). Typically such machines will have a clamp including a press which will provide a clamp stroke to close the mold, a device for heating or melting the plastic material into flowable form, and an injector for injecting the flowable plastic into the mold.

In the present invention, after the lace curtain has been inserted into the mold, staking means, such as a punch and die arrangement, is used to sever the interconnect members 14 while the lace curtain is in the mold. In a preferred arrangement, a mold described in more detail below, is configured such that it cooperates with the existing commercially available machines to execute the process of the present invention. In such an arrangement, the clamping members of the machine will first force the punch to sever the interconnect members 14 as the mold is being closed and then, as the stroke continues, to close the mold.

After the mold is closed, the insulating material, which is to form the base 20 of the insert molded connector, is injected into the mold through an aperture. The injection process is known in the art and therefore no further details are given here. The material is injected such that it completely surrounds the individual traces, thereby electrically isolating each of these traces.

Figure 5:
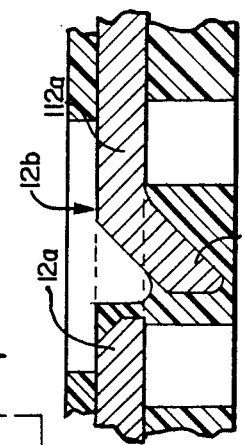
FIG. 5 is an enlarged view of a preferred embodiment of a severed interconnect member.

A particularly advantageous embodiment of the present invention is disclosed in FIG. 5 (shown in a highly enlarged view). Initially, an interconnect member is a flat piece of material in the lace curtain 10, as described above. After the staking operation has been performed by the punch in the mold, the interconnect member 12 is severed into two pieces 12a and 12b. As illustrated in this figure, the interconnect member 12 is not only severed but a section of one of the severed pieces 12b is bent away from the other of the pieces 12a. Therefore, the piece 12b will be formed into two sections, the first section 112a, which is still in the same plane as the original interconnect member (the same plane as member 12a) and a second bent piece 112b which is bent away from the severed piece 12a. In a preferred embodiment the angle that the bent piece 112b is approximately 45°.

This embodiment, wherein a section of one of the severed pieces is bent, is particularly advantageous since the gap between the two severed pieces 12a and 12b of the original interconnect member is increased. The gap now may be filled with the plastic insulating material which is injected into the mold.

Figure 4:
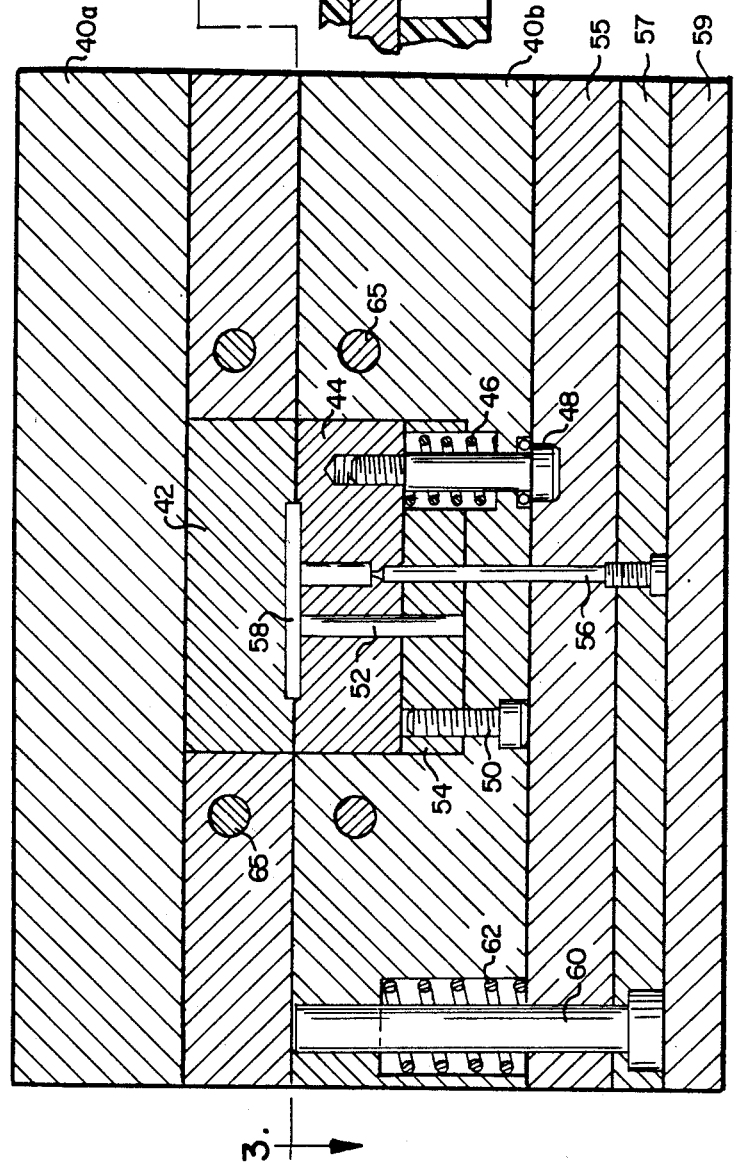
FIG. 4 is a side sectional view of the mold illustrated in FIG. 3.

Referring now to FIGS. 3 and 4, a particularly advantageous and novel mold for executing the process of the present invention is disclosed. The mold 40 includes an upper mold base section 40a and a lower mold base section 40b. The upper mold base section 40a includes an upper or top cavity block 42 and similarly the lower mold base section, 40b includes a lower or bottom cavity block 44. A cavity 58 is defined between the top and bottom cavity blocks 42 and 44. The cavity blocks 42, 44 includes holding sections 64 in the surfaces to maintain the lace curtain in position during the injection operation. A back-up plate 54 is provided to retain a punch 52 in a retractable fashion. Knock-out pins 56 (only one shown) are held by plates 57 and 59. The knock-out pins are used to remove the circuit after the injected material has cooled. A bolt 50 holds the back-up plate 54 stationary with respect to the bottom base section 40b. A bolt 60 and spring 62 are used to move the plates 57, 59 back to their initial position after the severing operation. A stripper bolt 48 and spring 46 cooperate to retractably move the lower cavity block 44 such that the punch 52 severs the interconnect members 14. The area between the lower base section 40b and the plate 57 is open space. A rail 55 is provided outside of this open space to guide the mold parts. Means are provided for engaging the press from the molding machine (not shown) such that the punch 52 is moved inwardly toward the lace curtain as the mold is closed by the press. Core pins 68 are provided the appropriate openings in the circuit module around the connecting sections 16. The punch 52 is moved forward sufficiently to sever the interconnect members 12. Apertures 65 are provided as water lines to cool or heat the mold as needed.

Preferably the punch 52 is configured such that it will form an angled section 112b of the interconnect member 12 after it has been severed, as described above. As the press from the machine continues in its forward stroke, the mold sections 40a and 40b are engaged to completely close the mold. The insulating material is then injected into the mold through an aperture 66 in a manner known in the art. After the insulating plastic material has cooled and formed into a solid, the mold is opened and the insert molded circuit is removed.

The mold of the present invention thus provides an economical arrangement which may be used with existing insert molding machinery to execute the process of the present invention. The method of the present invention produces an insert molded circuit wherein the severing of the interconnect members is accomplished in a single operation during the molding process. Unlike presently available methods, the secondary operation of severing the interconnect members after the plastic material has been formed is unnecessary. Further, the product which results from using the mold and process of the present invention is superior to products produced by existing insert molding processes. The insert molded circuit produced by the apparatus and process of the present invention is resistant to environmental effects such as fluids. The circuit may also be produced more efficiently than products produced with available processes, since the secondary operation is eliminated.

The foregoing description of the preferred embodiments of the present invention has been presented for purposes of illustration and description. They are not intended to be exhaustive or to limit the invention to the precise forms disclosed, and obviously many modifications and variations are possible in light of the above teachings. It is intended that the scope of the invention be defined by the following claims, including all equivalents.

We claim:

1. A method for forming an electrical connector from a lace curtain, wherein the lace curtain includes a plurality of electrical connectors joined by at least one interconnect joint, the method comprising the steps of:
   providing a mold having a cavity configured to receive the lace curtain;
   inserting the lace curtain in the cavity of the mold;
   while the lace curtain is in the mold, severing the interconnect joints; and
   after the interconnect joints have been severed, injecting a flowable, insulating material into the mold such that the insulating material surrounds the connectors.

2. The method of claim 1 wherein the step of severing the interconnect joints comprises the steps of:
   providing at least one punch for each respective interconnect joint, and disposing the respective punch in a position adjacent the respective interconnect joint;
   after the lace curtain has been inserted into the cavity of the mold, moving each respective punch to sever the respective interconnect joint; and
   after each respective interconnect joint has been severed, retracting each respective punch.

3. The method of claim 1 further comprising the step of bending one of the severed sections of the interconnect joint away from the other of the severed sections of the interconnect joint after the interconnect joint has been severed.

4. The method of claim 3 wherein the step of injecting the insulating material into the cavity of the mold includes filling the gap between the severed sections of the interconnect joint.

5. The method of claim I wherein the step of injecting the insulating material into the cavity of the mold includes filling the gap between the severed sections of the interconnect joint.

6. The method of claim 1 wherein the step of severing the interconnect joints comprises staking the joints with a punch and die arrangement.

7. A method for making a network of electrical connectors from a lace curtain, wherein the lace curtain includes a plurality of electrical connectors joined by at least one interconnect joint, the method comprising:
   providing a mold having a first section and a discrete mating second section, the mold having a closed position when the first and second sections are engaged, the first and second sections each having a mating cavity section;
   separating the first and second sections of the mold;
   disposing the lace curtain in the cavity of one of the first and second sections of the mold;
   after the lace curtain has been inserted, closing the mold;
   while the lace curtain is in the mold, severing the interconnect joints; and
   after the mold has been closed and after the interconnect joints have been severed, injecting an insulating material into the cavity of the mold.

8. The method of claim 7 wherein the step of injecting the insulating material into the cavity of the mold includes filling the gap between the severed sections of the interconnect joint.

9. The method of claim 7 wherein the step of severing the interconnect joints comprises staking the joints with a punch and die arrangement.

10. The method of claim 9 wherein the step of staking includes using a press to drive the punch and wherein the press is further used to close the mold.

11. The method of claim 7 further comprising the step of bending one of the severed sections of the interconnect joint away from the other of the severed sections of the interconnect joint after the interconnect joint has been severed.

12. The method of claim 11 wherein the step of injecting the insulating material into the cavity of the mold includes filling the gap between the severed sections of the interconnect joint.

13. The method of claim 7 wherein the step of injecting the insulating material into the cavity of the mold includes filling the gap between the severed sections of the interconnect joint.

* * * * *